United States Patent
Fidric (10) Patent No.: US 7,440,176 B2
(45) Date of Patent: Oct. 21, 2008

(54) BI-DIRECTIONALLY PUMPED OPTICAL FIBER LASERS AND AMPLIFIERS

(75) Inventor: Bernard Fidric, Cupertino, CA (US)

(73) Assignee: Newport Corporation, Irvine, CA (US)

( * ) Notice: Subject to any disclaimer, the term of this patent is extended or adjusted under 35 U.S.C. 154(b) by 0 days.

(21) Appl. No.: 11/707,467

(22) Filed: Feb. 15, 2007

(65) Prior Publication Data

US 2007/0236781 A1 Oct. 11, 2007

Related U.S. Application Data

(60) Provisional application No. 60/774,925, filed on Feb. 17, 2006.

(51) Int. Cl.
*H01S 4/00* (2006.01)
*H01S 3/067* (2006.01)

(52) U.S. Cl. ........................... 359/341.3; 372/6

(58) Field of Classification Search ............. 359/341.3; 372/6

See application file for complete search history.

(56) References Cited

U.S. PATENT DOCUMENTS

| | | |
|---|---|---|
| 5,144,486 A | 9/1992 | Hart |
| 5,365,366 A | 11/1994 | Kafka |
| 5,367,529 A | 11/1994 | Holsinger et al. |
| 5,446,749 A | 8/1995 | Nighan et al. |
| 5,579,422 A | 11/1996 | Head |
| 5,691,989 A | 11/1997 | Rakuljic et al. |
| 5,740,292 A * | 4/1998 | Strasser ................ 385/37 |
| 5,999,544 A | 12/1999 | Peterson |
| 6,064,515 A * | 5/2000 | Yang ................ 359/341.33 |
| 6,185,235 B1 | 2/2001 | Cheng et al. |
| 6,314,116 B1 | 11/2001 | Wright et al. |
| 6,335,822 B1 * | 1/2002 | Toyohara ............. 359/341.1 |
| 6,389,198 B2 | 5/2002 | Kafka et al. |
| 6,504,858 B2 | 1/2003 | Cheng et al. |
| 6,822,978 B2 | 11/2004 | Kafka et al. |
| 6,882,664 B2 * | 4/2005 | Bolshtyansky et al. ...... 372/6 |
| 6,891,876 B2 | 5/2005 | Sutter et al. |
| 6,898,231 B2 | 5/2005 | Butterworth |
| 6,922,419 B1 | 7/2005 | Nighan et al. |
| 6,931,037 B2 | 8/2005 | Nighan |
| 7,259,907 B2 * | 8/2007 | Langhans ............ 359/341.1 |
| 2003/0161357 A1 * | 8/2003 | Bolshtyansky et al. ...... 372/6 |
| 2004/0258117 A1 | 12/2004 | Nebel et al. |
| 2005/0018743 A1 | 1/2005 | Volodin et al. |
| 2005/0207454 A1 * | 9/2005 | Starodoumov et al. ...... 372/4 |
| 2005/0248819 A1 | 11/2005 | Hymel et al. |
| 2005/0248820 A1 | 11/2005 | Moser et al. |

OTHER PUBLICATIONS

Ghislotti et al., "Bidirectional pumping of Er-doped fibers using detuned 980-nm lasers," *IEEE Photonics Techonology Letters* 14(5):780-783 (May 200.

(Continued)

*Primary Examiner*—Eric Bolda
(74) *Attorney, Agent, or Firm*—Grant Anderson LLP (57) ABSTRACT

An optical system including a gain material pumped by pump energy bands delivered to the gain material from different directions and separated sufficiently to prevent crosstalk between pump energy sources. Embodiments of the pump energy sources may be configured to pump the gain material with pump energy bands that correspond to absorption bands of the gain material.

10 Claims, 4 Drawing Sheets

OTHER PUBLICATIONS

Piper et al., "1.2 mJ, 37 ns single-moded pulses at 10kHz repetition rate from a Q-switched ytterbium fiber laser," *Optoelectronic Research Center,* University of Southampton SO17 1BJ, UK.

Andersen et al., "High Repetition Rate Tunable Femtosecond Pulses from Fiber Laser Pumped Parametric Amplifier," Advanced Solid-State Photonics, ME2, Abstract of Talk 4:30pm Jan. 30, 2006.

Brunner et al., "Powerful red-green-blue laser source pumped with a mode-locked thin disk laser," Optics Letters 29(16):1921-1923, Aug. 15, 2004.

Kruglov et al., "Self-similar propagation of parabolic pulses in normal-dispersion fiber amplifiers," Josa B, 19(3):461-469 2002.

Moser et al., "Volume Bragg Grating Devices," Friday Morning Optical Fiber Communications Conference, 2003, OFC 2003 pp. 644-645, vol. 2, Mar. 28, 2003.

Ondax, Inc., "Volume Holographic Gratings (VHG)," 2005 pp. 1-7.

Steinmann et al., "Tunable fs Laser Pulses from OPA with MHz Repetition Rate," Advanced Solid-State Photonics, TuC6, Abstract of Talk, 12:30pm Jan. 31, 2006.

Volodin et al., Wavelength Stabilization and spectrum narrowing of high-power multimode laser diodes and arrays by use of volume Bragg gratings. Optics Letters 29(16): Aug. 15, 2004.

* cited by examiner

BI-DIRECTIONALLY PUMPED OPTICAL FIBER LASERS AND AMPLIFIERS

RELATED APPLICATIONS

This application claims priority under 35 U.S.C. section 119(e) from U.S. Provisional Patent application Ser. No. 60/774,925 titled "Bi-Directionally Pumped Optical Fiber Lasers and Amplifiers", filed Feb. 17, 2006, by B. Fidric which is also incorporated by reference herein in its entirety.

BACKGROUND

There is an ongoing need for laser and amplifier systems that produce high power while maintaining good output beam quality that can be manufactured at a reasonable cost. Typically, for a diode pumped laser system, pump light from one or more diode pump sources is directed to a solid state gain material that amplifies radiation at a desired wavelength. For such a system, not all of the pump light is converted to desirable radiation amplification; some of the pump light may be converted to heat and some pump light may leak from the system or from one component of the system to another component of the system before being absorbed in the gain material. Such residual leaked pump light from one component of the system to another may be detrimental to the operation of the system. In addition, temperature increases and gradients that result from the heat can lead to detrimental effects on the performance of the system. Examples of such detrimental effects can include bulk thermal lensing, surface bulging and changes to fundamental properties of the laser gain material such as the upper-state lifetime, thermal conductivity and thermal expansion of the material.

Applying pump light of a uniform or substantially uniform density or intensity to the gain material is one way to minimize the negative effects of heat generated by residual unabsorbed pump light. Such an approach usually requires injecting the pump light from multiple sources and directions into the gain material, either directly or indirectly. However, in such systems, there may be crosstalk between the two or more pump sources, particularly if the pump sources are emitting pump energy into the gain material or a conduit, such as an inner cladding of a double clad optical fiber amplifier, from opposite ends of the gain material or conduit. Such cross talk between pump energy sources may lead to feedback and instability in the pump energy sources, particularly in semiconductor lasers that are sensitive to feedback. What has been needed are systems and methods for pumping gain materials from at least two directions while minimizing or eliminating crosstalk and feedback between pump sources. What has also been needed are systems and methods that can produce a high energy output and be manufactured at a low cost.

SUMMARY

In some embodiments, a method of pumping an optical fiber laser system includes providing an optical fiber laser system having a double clad optical fiber element with an elongate core of gain material, a first cladding disposed about the core and a second cladding disposed about the first cladding and having two reflective elements optically coupled to the optical fiber element. Once the optical fiber laser system has been provided, pump energy is injected into the first cladding of the optical fiber element in a first direction with a first pump energy band emitted from a first pump energy source. Pump energy is also injected into the first cladding of the optical fiber element in a second direction with a second pump energy band emitted from a second pump energy source with the second pump energy band separated from the first pump energy band by a sufficient wavelength to prevent crosstalk between the first pump energy source and second pump energy source.

In some embodiments, a method of pumping an optical fiber amplifier system includes providing an optical fiber amplifier system having a double clad optical fiber element with an elongate core of gain material, a first cladding disposed about the core and a second cladding disposed about the first cladding. Pump energy is injected into the first cladding of the optical fiber element in a first direction with a first pump energy band emitted from a first pump energy source. Pump energy is also injected into the first cladding of the optical fiber element in a second direction with a second pump energy band emitted from a second pump energy source with the second pump energy band separated from the first pump energy band by a sufficient wavelength to prevent crosstalk between the first pump energy source and second pump energy source.

In some embodiments, a solid state optical gain system includes an optical fiber amplifier system having a double clad optical fiber element with an elongate core of gain material, a first cladding disposed about the core and a second cladding disposed about the first cladding. A first pump energy source is configured to emit a first pump energy band into the first cladding from a first direction. A second pump energy source is configured to emit a second pump energy band into the first cladding from a second direction with the first and second pump energy sources configured to emit respective first and second pump energy bands substantially separated to prevent crosstalk between the first and second pump energy sources.

These features of embodiments will become more apparent from the following detailed description when taken in conjunction with the accompanying exemplary drawings.

DETAILED DESCRIPTION

Gain materials such as the gain material in an active core of optical fiber amplifiers and lasers may be pumped in multiple directions from multiple pump energy sources in order to achieve a high energy output. However, in such systems there may be crosstalk between the two or more pump sources which may result in instability of the pump energy sources. This may be particularly true if the pump sources are counter-pumping the gain material and emitting pump energy into the gain material from opposite ends. In this type of system, residual unabsorbed pump energy from a first pump source may be directed toward and injected into a second pump source. Such cross talk between pump energy sources typically leads to feedback and instability in the one or more pump energy sources. Embodiments herein are directed to low cost high power solid state laser or amplifier systems including a gain material pumped by energy delivered to the gain material from different directions and having a separation of wavelength sufficient to prevent crosstalk between pump energy sources. Embodiments of the pump energy sources may be configured to pump the gain material with wavelengths that correspond or substantially correspond to an absorption band or absorption bands of the gain material. Some embodiments include optical fiber elements having a double clad configuration suitable for injection of pump energy into an inner cladding of the optical fiber element.

Figure 1:
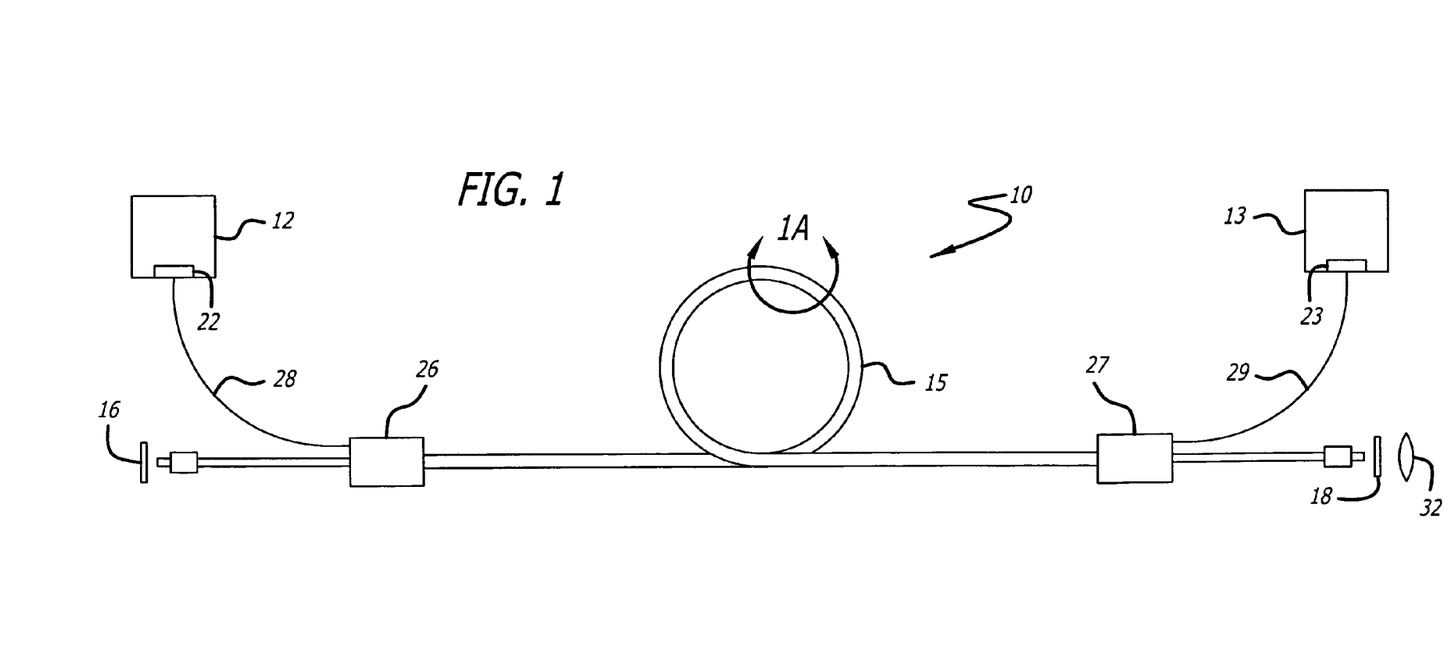
FIG. 1 illustrates an embodiment of a bi-directionally pumped optical fiber laser.

FIG. 1 illustrates an embodiment of a bi-directionally pumped fiber laser system 10 that includes pump energy sources in the form of a first diode pump source 12 and a second diode pump source 13. The system 10 includes a gain medium 14, in the form of an elongate doped core 14A of a double clad optical fiber element 15. The optical fiber element 15 may be a double clad embodiment as shown, or may have any other suitable configuration for other embodiments such as a multi-mode step-index fiber or single mode optical fiber. However, the use of doped double clad optical fiber material for the optical fiber element 15 allows for higher output at a lower manufacturing cost than would a similar system using single mode fiber material for the optical fiber element. In particular, currently available single mode diode pump sources for some embodiments can produce an output of about 0.5 Watts, or up to about 0.5 Watts, whereas currently available multimode diode pump sources for some of the embodiments discussed herein may produce over 6 Watts of output power at about one fourth the cost of the single mode diode pump source.

The gain medium 14 of the core 14A is disposed between or otherwise optically coupled to a first reflective element 16 and a second reflective element or coupler 18. The first reflective element 16 together with the second reflective element 18 form a lasing cavity therebetween. Although the first and second reflective elements 16 and 18 are shown as external elements outside the optical fiber element 15, for some embodiments the reflective elements may be disposed integrally with end portions of the cladding or core of the optical fiber element 15. The reflective elements may include mirrors, mirrored surfaces of the optical fiber element 15, gratings including gratings formed integrally with the optical fiber element 15, and the like. System 10 is shown with two reflective elements 16 and 18, however, 3 or more reflective elements may be used with the system. In addition, laser systems having 2, 3, 4 or more optics in the laser cavity are contemplated wherein the optics may include reflective optics, lenses, wave plates, polarizers or the like.

Figure 1A:
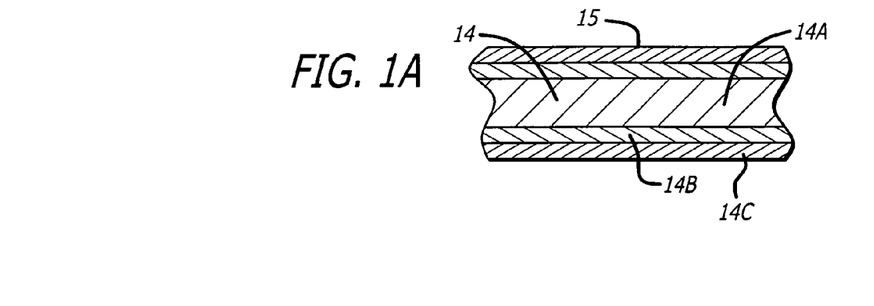
FIG. 1A shows an enlarged view in section of a double clad optical fiber element of the optical fiber laser system of FIG. 1.

FIG. 1A illustrates an enlarged view in longitudinal section of a portion of the optical fiber element 15 showing the gain material 14 of the elongate core 14A of the optical fiber element 15 surrounded by a first or inner cladding material 14B concentrically disposed about the core 14A. A second or outer cladding material 14C is disposed about the inner cladding 14B in a substantially concentric arrangement. Some embodiments of the laser gain material 14 and corresponding optical fiber element 15 may have a length of about 0.1 m to about 40 m and a transverse dimension of about 5 microns to about 100 microns. The transverse cross section of the laser gain material 14 or first cladding 14B may be round, elliptical or any other suitable shape or configuration.

Some embodiments of optical fiber element 15 include a doped core 14A of gain material 14 with a transverse dimension of about 10 microns to about 50 microns, a first cladding 14B having an outer transverse dimension of about 200 microns to about 400 microns and a second cladding 14C having an outer transverse dimension of about 300 microns to about 500 microns. The gain material 14 of the doped core 14A may include thulium, erbium, ytterbium or erbium-ytterbium doped silica having a doping concentration of about 0.2 percent by weight doping to about 3.0 percent by weight doping. Other gain materials may include neodymium doped vanadate, ytterbium doped tungstates or any other suitable material. The first cladding 14B may be made from silica without any significant impurities or doping. The second or outer cladding 14C may be made from polymers such as polyfluoromers having a low index of refraction relative to the first cladding 14B. In this configuration, the core 14A may have a numerical aperture of about 0.03 to about 0.10 and the first cladding 14B may have a numerical aperture of about 0.4 to about 0.6. For such embodiments of dual clad optical fiber elements 15, pump light energy from diode pump sources 12 and 13 may be injected into the first cladding 14B either from the ends of the first cladding 14B or by side injection. For such embodiments, the middle or peak wavelength of lasing emission peaks of the laser gain material 14 may be about 1000 nm to about 1100 nm, more specifically, about 1064 nm, and the pump light or energy wavelength may be about 800 nm to about 1000 nm, more specifically, about 900 nm to about 990 nm. The full width half maximum wavelength band for some gain materials 14 may be about 6 nm to about 8 nm.

Figure 2:
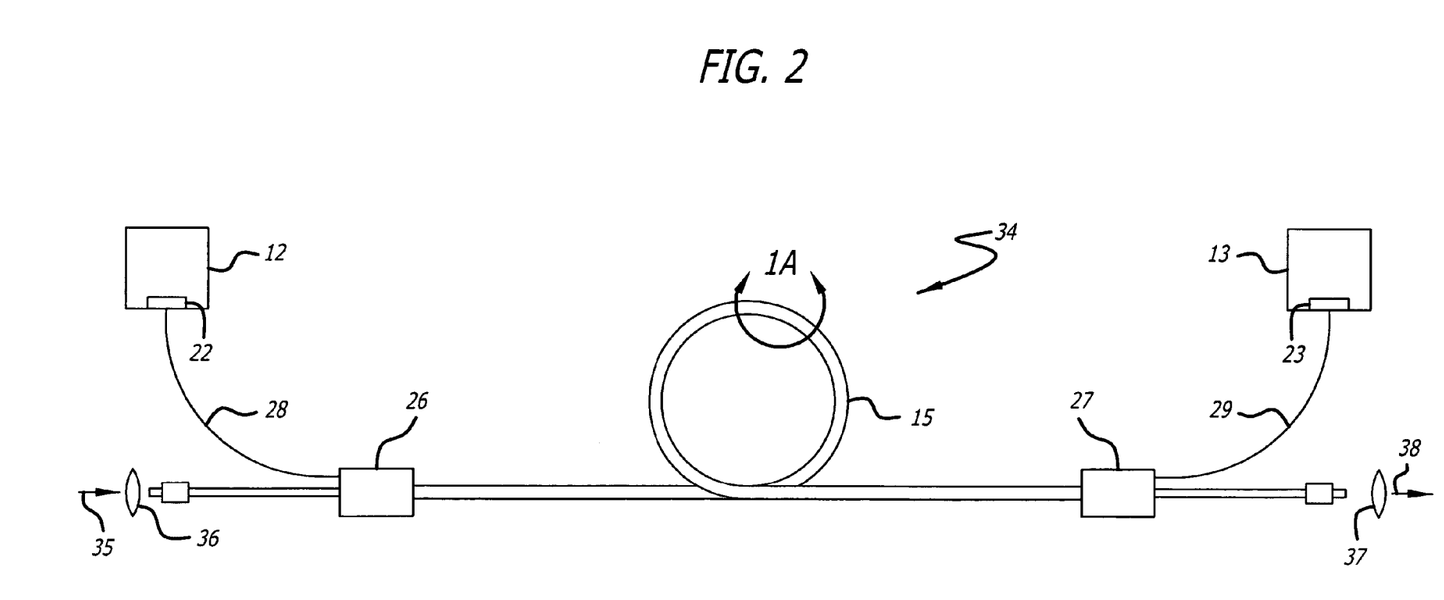
FIG. 2 illustrates an embodiment of a bi-directionally pumped optical fiber amplifier.

In addition to the laser system 10 shown in FIGS. 1 and 1A, a similar configuration may be used for a fiber amplifier system 34, as shown in FIG. 2. FIG. 2 illustrates an embodiment of a bi-directionally pumped fiber amplifier system 34 having the same basic configuration and components as the configuration and components of the fiber laser system 10. The inner cladding 14B of the fiber optic element 15 is pumped in the same manner by the same or similar components, however, there is no laser cavity in the amplifier embodiment. For the fiber amplifier system, an input signal, as indicated by arrow 35, may be directed into a first end of the system 34 through a first focussing element or optic 36. An amplified signal is emitted from an opposite or second end of the system through a collimating element or optic 37, as indicated by arrow 38.

The diode pump sources 12 and 13, which may be multi-mode diode pump sources, are coupled to corresponding optional bandwidth narrowing or wavelength-locking or control elements 22 and 23 which may be enclosed within a housing of the diode pump sources 12 and 13. Although the systems 10 and 34 are shown with two diode pump sources, any suitable number of diode pump sources may be used and coupled to the optical fiber element 15 from any suitable direction or orientation. The wavelength-locking elements 22 and 23 may be disposed externally to the diode pump sources 12 and 13 in some embodiments, and optically coupled to the diode pump sources 12 and 13 with an optical coupler such as an optical conduit in the form of an optical fiber or optical fiber bundle. An output of pump light energy from the wavelength-locking elements 22 and 23 is optically coupled to corresponding coupler elements 26 and 27 by optical conduits in the form of optical fibers or optical fiber bundles 28 and 29 but any other suitable optical couplers may be used. The wavelength-locking or wavelength control elements 22 and 23 may be Volume Bragg Gratings (VBG), Fiber Bragg Gratings (FBG) or any other suitable device that serves to selectively narrow the output of the diode pump sources 12 and 13. Some embodiments of wavelength-locking elements may be partially reflective elements which are wavelength selective with regard to the light energy reflected thereby. Such wavelength-locking elements in the form of VBGs, FBGs or the like may be used to narrow or otherwise control a wavelength band of the output of diode pump sources by providing wavelength-selective optical feedback to the diode pump sources 12 and 13 which causes the diode pump sources to operate and generate output within a selected wavelength band corresponding to the wavelength-selective optical feedback.

Embodiments of the wavelength-locking elements 22 and 23 may be configured to facilitate the emission of narrow band pump light embodiments having a full width half-maximum bandwidth of less than about 1.0 nm, specifically, a bandwidth of about 0.2 nm to about 0.7 nm, and more specifically, a bandwidth of about 0.3 nm to about 0.5 nm. Various wavelength locking element embodiments 22 and 23 that can be used to achieve substantially wavelength locked operation from a diode pump source can include the use of a VBG such as those manufactured by PD-LD, Inc. in Pennington, N.J., or manufactured by Ondax, Inc. in Monrovia, Calif. These devices can be used to provide a narrow spectral bandwidth from the pump diodes, as well as a stabilized central wavelength. Such embodiments have been described in U.S. Provisional Patent Application titled "Line Narrowed Laser Diode System and Method of Use", Ser. No. 60/623,376, filed by Treusch et al. on Oct. 28, 2004, which is incorporated by reference herein in its entirety. Alternatively, a wavelength selective thin-film coating may be utilized as a wavelength locking element. However, any embodiment that provides an appropriately narrow band and/or wavelength stable pump light source may be used in the embodiments discussed herein.

The use of narrow band, wavelength stabilized pump light sources 12 and 13 provides a central wavelength that is very well stabilized. As such, it is relatively straightforward to operate at any point on an absorption curve of a gain material 14, even points where the absorption changes relatively quickly with respect to pump light wavelength, because the wavelength of the pump energy band of the pump light will remain substantially fixed. In addition, because the pump energy band is relatively narrow, it may be possible to pump the gain material 14 with two separate pump energy bands centered at different wavelengths that are both within a single absorption peak of the gain material 14. This enables the pump energy wavelength to be chosen based solely on other properties of the gain material and separation of multiple pump energy bands necessary to prevent detrimental crosstalk between the diode pump sources 12 and 13.

Pump energy may be used for counter-pumping the gain material 14 whereby the pump energy is emitted from the diode pump sources 12 and 13 and passed through the wavelength-locking elements 22 and 23 to narrow the bandwidth of the resulting pump bands. The pump bands are then directed to the coupler elements 26 and 27 into the inner cladding 14B of the optical fiber element 15. The pump bands are injected into or is otherwise transferred into the core 14A from the inner cladding 14B in order to pump the gain material 14 and produce an output laser beam that may be emitted from the second reflective element 18. The output laser beam may be propagated through a collimating optic 32 that is configured to collimate the energy emitted from the lasing cavity between reflective elements 16 and 18. During the pumping process, unabsorbed residual pump energy from diode pump source 12 may be leaked or injected into diode pump source 13, or vice versa, and generate detrimental crosstalk between diode pump sources 12 and 13. The crosstalk may in turn lead to instability of the system 10 if the leakage into a given diode pump source is too high in relation to the pump energy being discharged from the diode pump source.

Figure 3:
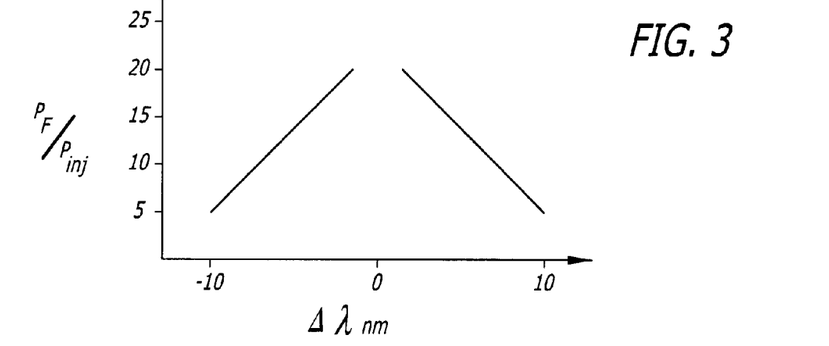
FIG. 3 is a graphical representation of a separation of wavelength centers of pump energy bands ($\Delta\lambda$) versus the ratio of output power of a diode pump source ($P_F$) to power injected into the diode pump source ($P_{inj}$) from another diode pump source.

In order to prevent detrimental crosstalk between diode pump sources 12 and 13, the wavelengths of the pump bands of the respective diode pump sources 12 and 13 must be sufficiently separated or otherwise de-tuned. The amount of separation between respective pump energy bands may vary depending on a variety of factors. For example, a separation of pump energy bands may depend on the amount of unabsorbed pump energy injected from one diode pump source 12 into another diode pump source 13, or vice versa, by virtue of leakage of the reflective elements 16 and 18 (or other reflective elements not shown) of the systems 10 and 34. FIG. 3 is a graphical representation of a separation of wavelength centers of pump energy bands ($\Delta\lambda$) versus the ratio of output power of a diode pump source ($P_F$) to power injected into the diode pump source ($P_{inj}$) from another diode pump source. The curve shown represents an approximation of the minimum output power ($P_F$) necessary for preventing instability in the pump diodes of the system for a given leakage of the reflective elements of a system and $\Delta\lambda$. As can be seen from the graph of FIG. 3, the lower the value of $\Delta\lambda$, the greater the ratio of output power to power injected into a diode pump source required for stability. As such, if a large $\Delta\lambda$ is used for two diode pump sources in a system, there is greater latitude for the components of the remainder of the system.

Figure 4:
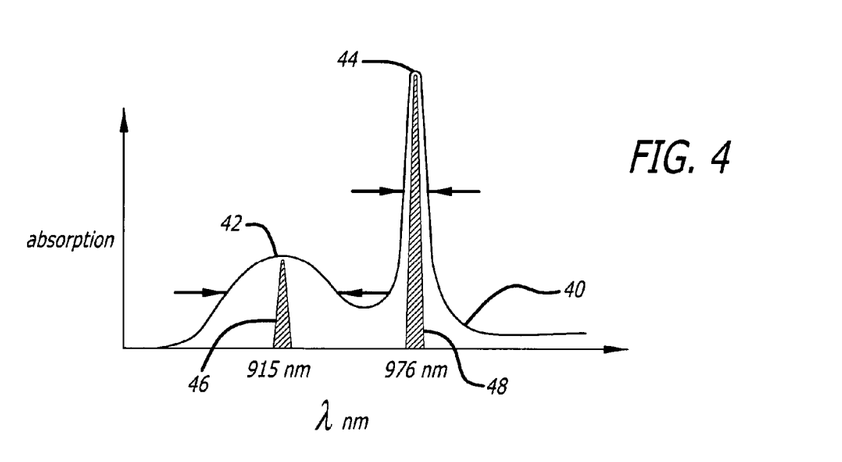
FIG. 4 is a graphical representation of an absorption spectrum of an ytterbium doped gain material showing absorption peaks at wavelengths of about 915 nm and about 976 nm and showing pump energy bands disposed within the absorption peaks.

FIG. 4 is a graphical representation of an absorption spectrum 40 of the gain medium 14 of an ytterbium doped optical fiber laser 10 showing a first absorption band 42 for the gain material 14 substantially centered at a wavelength of about 915 nm and a second absorption band 44 substantially centered at a wavelength of about 976 nm. A first pump energy band 46 from a first diode pump source 12 is shown substantially centered within the first absorption peak 42. A second pump energy band 48 from a second diode pump source 13 is shown substantially centered within the second absorption peak 44 of the gain material 14. The separation of the wavelength of the first pump energy band 46 from the wavelength of the second pump energy band 48 is such that leakage of unabsorbed residual pump energy from the first diode pump source 12 into the second diode pump source 13 will not cause significant instability in the second diode pump source 13. In addition, leakage of unabsorbed residual pump energy from the second diode pump energy source 13 into the first diode pump energy source 12 will not cause significant instability in the first diode pump source 12. Although the first pump energy band 46 and second pump energy band 48 are shown as being narrowed or otherwise wavelength locked, this may not be necessary depending on the separation of the respective absorption bands 42 and 44 of the gain material 14. In this embodiment, there is no significant overlap of the pump energy bands 46 and 48 in the system 10.

Figure 5:
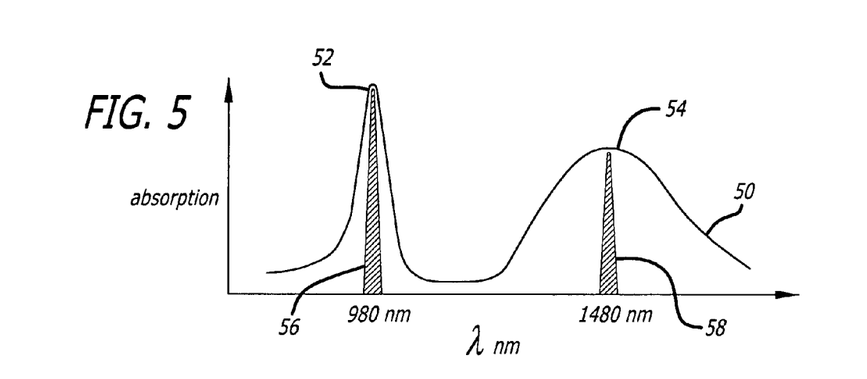
FIG. 5 is a graphical representation of an absorption spectrum of an erbium doped gain material showing absorption peaks at wavelengths of about 980 nm and about 1480 nm and showing pump energy bands disposed within the absorption peaks.

FIG. 5 is a graphical representation of an absorption spectrum 50 of an erbium doped optical fiber laser 10 showing a first absorption band 52 substantially centered at a wavelength of about 980 nm and a second absorption band 54 substantially centered at a wavelength of about 1480 nm. A first pump energy band 56 from a first diode pump source 12 is shown substantially centered within the first absorption band 52. A second pump energy band 58 from a second diode pump source 13 is shown substantially centered within the second absorption band 54 of the gain material 14. Once again, the separation of the wavelength of the first pump energy band 56 from the wavelength of the second pump energy band 58 is such that leakage of unabsorbed residual pump energy from the first diode pump source 12 into the second diode pump source 13 will not cause significant instability in the second diode pump source 13. Also, leakage of unabsorbed residual pump energy from the second diode pump source 13 into the first diode pump source 12 will not cause significant instability in the first diode pump source 12.

Figure 6:
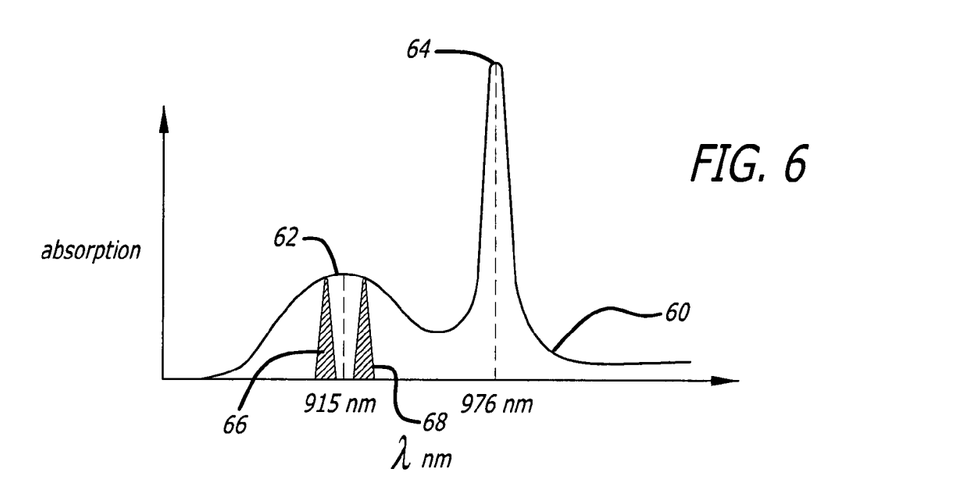
FIG. 6 is a graphical representation of an absorption spectrum of an ytterbium doped gain material showing absorption bands centered at wavelengths of about 915 nm and about 976 nm and showing pump energy bands disposed within one of the absorption bands.

FIG. 6 is a graphical representation of an absorption spectrum 60 of an ytterbium doped optical fiber laser 10 showing a first absorption band 62 centered at a wavelength of about 915 nm and a second absorption band 64 centered at a wavelength of about 976 nm, as shown above in FIG. 4. A first pump energy band 66 from a first diode pump source 12 is shown disposed under the first absorption peak 62. A second pump energy band 68 from a second diode pump source 13 is also shown disposed under the first absorption peak 62 of the gain material 14, but separated from the first pump energy band 66 with no overlap between the first pump energy band 66 and second pump energy band 68. Given the separation of the first pump energy band 66 from the second pump energy band 68, such a configuration would likely require the application of a bandwidth narrowing or wavelength locking mechanism on at least one of the diode pump sources 12 and 13. In the embodiment shown in FIG. 6, wavelength locking elements 22 and 23 have been applied to the output of the first and second diode pump sources 12 and 13, respectively. This configuration allows for multiple pump energy bands, such as the two pump energy bands 66 and 68, to be disposed within a single absorption band, such as the first absorption band 62, without any significant overlap between the pump energy bands 66 and 68. As such, instability in either of the diode pump sources, such as diode pump sources 12 and 13, is prevented.

Figure 7:
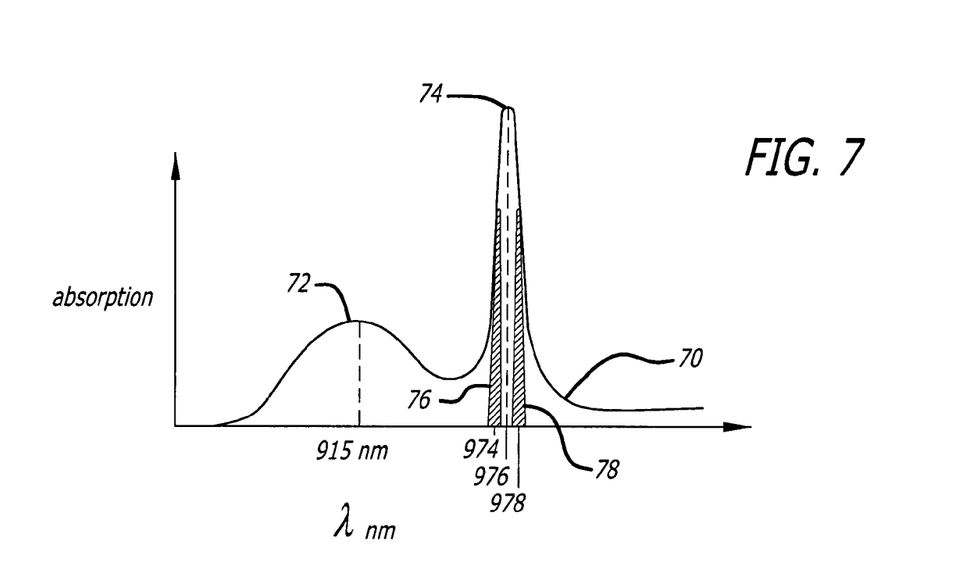
FIG. 7 is a graphical representation of an absorption spectrum of an ytterbium doped gain material showing absorption bands centered at wavelengths of about 915 nm and about 976 nm and showing pump energy bands disposed within one of the absorption bands.

FIG. 7 is a graphical representation of an absorption spectrum 70 of an ytterbium doped gain material for an optical fiber laser showing a first absorption band 72 centered at a wavelength of about 915 nm and a second absorption band 74 centered at a wavelength of about 976 nm. A first pump energy band 76 from a first diode pump source 12 is shown disposed under the second absorption peak 74. A second pump energy band 78 from a second diode pump source 13 is also shown disposed under the second absorption peak 74 of the gain material 14, but separated from the first pump energy band 76 with no significant overlap between the first pump energy band 76 and second pump energy band 78. Again, given the wavelength separation of the first pump energy band 76 from the second pump energy band 78, such a configuration would likely require the application of a bandwidth narrowing or wavelength locking mechanism on at least one of the diode pump sources 12 and 13. In the embodiment shown in FIG. 7, wavelength locking elements 22 and 23 have been applied to the output of the first and second diode pump sources 12 and 13, respectively. This configuration allows for multiple pump energy bands, such as the two pump energy bands 76 and 78, to be disposed within a single absorption band, such as the second relatively narrow absorption band 74, without any significant overlap between the pump energy bands 76 and 78. As such, instability in either of the diode pump sources, such as diode pump sources 12 and 13, is prevented while allowing all pump energy to be disposed within the second absorption band 74 which is the stronger absorption band for the gain material 14. In addition, although the embodiments above have two pump energy bands, the same configuration may be used with 3 or more pump energy bands.

With regard to the above detailed description, like reference numerals used therein refer to like elements that may have the same or similar dimensions, materials and configurations. While particular forms of embodiments have been illustrated and described, it will be apparent that various modifications can be made without departing from the spirit and scope of the embodiments of the invention. Accordingly, it is not intended that the invention be limited by the forgoing detailed description.

What is claimed is:

1. A method of pumping an optical fiber laser system, comprising:
    providing an optical fiber laser system having a double clad optical fiber element with an elongate core comprising gain material, a first cladding disposed about the core and a second cladding disposed about the first cladding, and having two reflective elements optically coupled to the optical fiber element forming a laser cavity;
    wavelength locking a first pump energy band emitted from a first pump energy source with a volume Bragg grating;
    injecting wavelength locked pump energy of the first pump energy band into the first cladding of the optical fiber element in a first direction;
    wavelength locking a second pump energy band emitted from a second pump energy source with a volume Bragg grating with a wavelength band of the second pump energy band sufficiently separated from a wavelength band of the first pump energy band to prevent crosstalk between the first pump energy source and the second pump energy source and with the first pump enemy band and the second pump energy band disposed within a single absorption band of the gain material of the elongate core; and
    injecting wavelength locked pump energy of the second pump energy band into the first cladding of the optical fiber element in a second direction different from the first direction.

2. The method of claim 1 wherein the full width half-maximum of the first pump energy band is narrowed to less than about 2.0 nm.

3. The method of claim 1 wherein first direction and second direction are substantially opposite to each other and the first direction is directed substantially toward the second pump energy source and the second direction is directed substantially toward the first pump energy source.

4. A method of pumping an optical fiber amplifier system, comprising:
    providing an optical fiber amplifier system having a double clad optical fiber element with an elongate core comprising gain material, a first cladding disposed about the core and a second cladding disposed about the first cladding;

wavelength locking a first pump energy band emitted from a first pump energy source with a volume Brag grating;

injecting wavelength locked pump energy of the first pump energy band into the first cladding of the optical fiber element in a first direction;

wavelength locking a second pump energy band emitted from a second pump energy source with a volume Bragg grating with a wavelength band of the second pump energy band sufficiently separated from a wavelength band of the first pump energy band to prevent crosstalk between the first pump energy source and the second pump energy source and with the first pump energy band and the second pump energy band disposed within a single absorption band of the gain material of the elongate core; and injecting wavelength locked pump energy of the second pump energy band into the first cladding of the optical fiber element in a second direction different from the first direction.

5. The method of claim 4 wherein the full width half-maximum of the first pump energy band is narrowed to less than about 2.0 nm.

6. The method of claim 4 wherein first direction and second direction are substantially opposite to each other and the first direction is directed substantially toward the second pump energy source and the second direction is directed substantially toward the first pump energy source.

7. An optical gain system, comprising:

an optical fiber amplifier system having a double clad optical fiber element with an elongate core comprising gain material, a first cladding disposed about the core and a second cladding disposed about the first cladding;

a first pump energy source configured to emit pump energy into the first cladding from a first direction;

a first volume Bragg grating disposed in an optical path between the first pump energy source and the first cladding and configured to wavelength lock pump energy emitted from the first pump energy source to a first pump energy band;

a second pump energy source configured to emit pump energy into the first cladding from a second direction different from the first direction; and a second volume Bragg grating disposed in an optical path between the second pump energy source and the first cladding and configured to wavelength lock pump energy emitted from the second pump energy source to a second pump energy band sufficiently separated from the first pump energy band to prevent crosstalk between the first pump energy source and the second pump energy source and with the first pump enemy band and the second pump energy band disposed within a single absorption band of the gain material of the elongate core.

8. The system of claim 7 wherein the pump energy sources comprise diode pump sources.

9. The system of claim 8 wherein the diode pump sources comprise multi-mode diode pump sources.

10. The system of claim 7 wherein the first direction is substantially opposite the second direction and the first direction is directed substantially toward the second pump energy source and the second direction is directed substantially toward the first pump energy source.

* * * * *